(12) United States Patent
Patel et al.

(10) Patent No.: US 8,445,308 B2
(45) Date of Patent: May 21, 2013

(54) FABRICATION OF PHOSPHOR DOTS AND APPLICATION OF PHOSPHOR DOTS TO ARRAYS OF LIGHTING ELEMENTS

(75) Inventors: Jasbir N. Patel, Port Moody (CA); Philippe M. Schick, Vancouver (CA); Michael Tischler, Scottsdale, AZ (US)

(73) Assignee: Cooledge Lighting Inc., Burnaby (CA)

( * ) Notice: Subject to any disclaimer, the term of this patent is extended or adjusted under 35 U.S.C. 154(b) by 49 days.

(21) Appl. No.: 13/273,313

(22) Filed: Oct. 14, 2011

(65) Prior Publication Data

US 2012/0094406 A1 Apr. 19, 2012

Related U.S. Application Data

(60) Provisional application No. 61/393,816, filed on Oct. 15, 2010.

(51) Int. Cl.
*H01L 21/00* (2006.01)

(52) U.S. Cl.
USPC ................................. 438/69; 257/E33.056

(58) Field of Classification Search
USPC ................. 438/27, 69, 493, 956; 257/82, 98, 257/E33.056
See application file for complete search history.

(56) References Cited

U.S. PATENT DOCUMENTS

2010/0181582 A1* 7/2010 Li et al. ........................ 257/91

* cited by examiner

*Primary Examiner* — Quoc Hoang
(74) *Attorney, Agent, or Firm* — Bingham McCutchen LLP

(57) ABSTRACT

In accordance with certain embodiments, arrays of phosphor dots are formed and associated with arrays of light-emitting elements to form lighting systems.

84 Claims, 4 Drawing Sheets

FABRICATION OF PHOSPHOR DOTS AND APPLICATION OF PHOSPHOR DOTS TO ARRAYS OF LIGHTING ELEMENTS

RELATED APPLICATION

This application claims the benefit of and priority to U.S. Provisional Patent Application No. 61/393,816, filed Oct. 15, 2010, the entire disclosure of which is hereby incorporated herein by reference.

FIELD OF THE INVENTION

The present invention generally relates to wavelength conversion of electromagnetic radiation, and more specifically to array-based electronic devices incorporating wavelength-conversion materials.

BACKGROUND

Solid-state lighting solutions based on light-emitting diodes (LEDs) often incorporate phosphors to shift the wavelength of at least a portion of the light emitted by the LED die to another desired wavelength. The wavelength-shifted (or "color-shifted") light is then emitted from the phosphor alone or color-mixed with another portion of the original light emitted by the LED die. Typical examples include ultraviolet (UV) LEDs with phosphors that emit white light and blue LEDs with phosphors that emit yellow light (which is mixed with blue light to form white light). Thus, phosphor incorporation may be utilized to produce aesthetically pleasing or functionally useful spectral outputs, which may require wavelength(s) that are different from the raw output of the LEDs. Such spectral outputs may be, e.g., warm white, cool white, or light with an increased color rendering index. Phosphors may also be utilized to produce large numbers of spectrally consistent light sources, as the phosphors may be applied to correct for variations in the wavelength of nominally similar LEDs.

Conventional phosphor deposition techniques commonly include direct deposition of the phosphor on LEDs; application of a phosphor slurry on the inside of fluorescent tubes or monochrome cathode ray tubes; photolithographically patterned deposition on the inside of color cathode ray tubes; and encapsulation of the phosphor in polymer films or lenses, which may be positioned adjacent or apart from a light source. Silk-screen-printing techniques may be used to apply thin phosphor dots to planar substrates, without consideration to the form of (or the ability to shape) the edge profiles of the dots. For example, in screen-printing or stencil-printing techniques, the edge profile of the stencil or mask on the screen is generally substantially perpendicular to the surface of the mask or stencil and often formed with a low degree of accuracy and/or reproducibility. Furthermore, the edge profile of the phosphor made by such techniques is generally strongly dependent upon the properties of the phosphor slurry utilized in such methods. These methods typically require a low-viscosity slurry, which tends to spread after removal of the screen print or stencil mask. In some cases the slurry may even spread under the mask edges because of difficulties achieving complete contact between the mask and substrate over an entire large area. Furthermore, the thickness of phosphors deposited by screen-printing techniques is dependent on the mask (or screen) thickness, which is typically not adjustable.

Direct deposition of phosphor slurry over an LED also has disadvantages. Specifically, the final shape and thickness of the phosphor are dependent upon the phosphor slurry viscosity, the elapsed time between deposition and curing, and the curing temperature. Direct deposition generally produces substantially hemispherical phosphor shapes, because these shapes minimize the surface energy of the unconstrained slurry. Thus, direct deposition is generally incapable of achieving an arbitrary phosphor shape. Control of the phosphor shape and thickness are strongly dependent on a range of process parameters, making control and reproducibility difficult to achieve.

Traditionally, LED dies range in size from approximately 300 μm edge-length up to several millimeters in edge length and are packaged individually or in densely packed groups in order to provide lighting packages at the lowest possible cost. In some applications (particularly in arrays), smaller LEDs having dimensions in the range of about 25 μm to about 500 μm (or even smaller) may be utilized. The use of such small LEDs (or arrays thereof) presents challenges for the integration of a phosphor. In order to minimize costs for many applications, the phosphor should be applied near the LEDs rather than over an entire package. Furthermore, the wavelength-conversion efficacy is directly related to its thickness and concentration. In some cases similar results may be achieved by a relatively thicker phosphor layer with a lower phosphor concentration, as with a relatively thinner phosphor layer with a higher phosphor concentration. Moreover, a single uniform shape and size of the phosphor may not adequately address wavelength conversion for multiple LEDs, particularly when one or more of the LEDs emit light from their top and/or side surfaces. For example, a uniformly thick phosphor may result in non-uniform color characteristics as a function of emission angle.

In view of the foregoing, there is a need for techniques for the production of small phosphors with well controlled and repeatable dimensions and geometries suitable for solid-state lighting applications, particularly large arrays of such phosphors for integration with arrays of light-emitting devices.

SUMMARY

In accordance with certain embodiments, one or more phosphor dots (e.g., an array of phosphor dots) are created and transferred to an LED or array thereof in a manner that affords wide geometric flexibility, both in terms of the phosphor dots themselves and their relative arrangement. Various embodiments of the present invention provide more accurate control over the thickness and profile of the phosphor. Control of the phosphor thickness and/or edge profile enables the use of the phosphor dots in a host of applications, including as wavelength converters in solid-state lighting, for example in arrays of LEDs.

Specific embodiments of the present invention involve molding of the phosphor dots, and the thickness, shape, and profile are determined by the mold. Relatively straightforward formation of layers of phosphor (i.e., phosphor dots) and/or other material is thereby realized. For example, a remote phosphor configuration may be constructed by molding a layer of transparent material followed by a layer of phosphor material. In other embodiments multiple layers of different phosphors may be formed. Embodiments of the present invention provide a cost-effective batch process for forming very large arrays of arbitrary-shaped phosphor dots that may be coupled to light emitting elements in a batch process.

As used herein, "phosphor" refers to any material that shifts the wavelength of light irradiating it and/or that is luminescent, fluorescent, and/or phosphorescent. Phosphors may be in the form of powders or particles and in such case may be mixed in binders, e.g., silicone. As used herein, phosphor may refer to the powder or particles or to the powder or particles plus binder. "Phosphor dots" are localized regions of phosphor, typically with thicknesses, surface contours, and/or edge profiles customized for a specific application.

Phosphor dots in accordance with various embodiments of the invention are produced by at least partially filling recesses in a substrate with a precursor (i.e., uncured) phosphor slurry, curing the slurry to form the phosphor dots, and removing them from the substrate. The phosphor dots may be adhered to a separate substrate or film while still in the recesses, and then the dots may be removed via detachment of the film from the recess-containing substrate. The shape, size, and arrangement of the recesses in the substrate are utilized to form the phosphor dots having those characteristics desired for a specific application. For example, once removed from the recess-containing substrate (e.g., adhered to the film), the dots may be attached to an array of light-emitting elements and in alignment therewith.

The term "light-emitting element" (or "LEE") is defined as any device that emits electromagnetic radiation at a wavelength or within a wavelength regime of interest, for example, a visible, infrared or ultraviolet regime, when activated, by applying a potential difference across the device and/or passing a current through the device. Examples of LEEs include solid-state, organic, polymer, phosphor-coated or high-flux LEDs, micro LEDs, laser diodes, and other similar devices as would be readily understood. The emitted radiation of an LEE may be visible, such as red, blue, or green, or invisible, such as infrared or ultraviolet. An LEE may produce radiation of a spread of wavelengths. An LEE may include a phosphorescent or fluorescent material for converting a portion of its emissions from one set of wavelengths to another. An LEE may include multiple LEEs, each emitting essentially the same or different wavelengths.

In various embodiments of the present invention, in order to produce levels of light similar to those produced by a large-format LEE, multiple LEEs (e.g., small LEDs or micro LEDs) are employed. Embodiments of the invention described herein are compatible with large-panel-processing techniques, such as those used in the display industry or in "roll-to-roll" processing, and may be utilized to form very large sheets or panels with thousands (or more) of small LEDs or micro LEDs. Combining large arrays of phosphor dots with large arrays (or "lightsheets") of small LEDs facilitates formation of broad-area lighting systems with widely variable bulk and LED geometries. Additional optional components, such as suitable power supply, driver circuitry, optical elements, and the like may be combined with a basic lightsheet (containing LEDs and phosphors) to form a wide variety of lighting systems.

In an aspect, embodiments of the invention feature a method of forming a lighting system that includes an array of light-emitting elements arranged in a geometric pattern on a first substrate. An array of recesses is formed in a second substrate different from the first substrate in a pattern corresponding to at least a portion of the geometric pattern. A phosphor dot is formed in each recess and at least partially fills the recess. The phosphor dots are transferred from the second substrate to the first substrate such that each phosphor dot is positioned to wavelength-convert at least a portion of light emitted by a corresponding light-emitting element on the first substrate.

Embodiments of the invention feature one or more of the following in any of a variety of combinations. Forming the phosphor dot may include or consist essentially of (i) at least partially filling the recess with a slurry that includes or consists essentially of phosphor particles and a binder, and (ii) curing the slurry. The slurry may be substantially removed from the surface of the second substrate (e.g., between the recesses) and/or degassed (e.g., by application of a partial vacuum). Curing the slurry may include or consist essentially of application of heat and/or ultraviolet radiation. Each of the light-emitting elements may be embedded within the first substrate such that its top surface is substantially coplanar with the top surface of the first substrate. Forming the array of recesses may include or consist essentially of etching, molding, machining, and/or laser cutting. At least one of the light-emitting elements may include or consist essentially of a light-emitting diode. A sidewall of at least one of the phosphor dots may form an angle with the top surface of the first substrate ranging between approximately 5° and approximately 90°.

Transferring the phosphor dots may include or consist essentially of (i) forming a film over the second substrate, thereby adhering the phosphor dots to the film, (ii) removing the film from the second substrate, the phosphor dots remaining adhered to the film, and (iii) bonding the film to the first substrate. Forming the film over the second substrate may include or consist essentially of dispersing a liquid or gel precursor of the film over the second substrate and curing the precursor, thereby forming the film. The precursor may be degassed prior to curing. Bonding the film to the first substrate may include or consist essentially of adhering each phosphor dot directly to a different light-emitting element. Portions of the film and the first substrate disposed around the adhered phosphor dots and light-emitting elements may not be in contact. An optically transmissive encapsulating layer may be formed between the non-contacted portions of the film and the first substrate. After bonding the film to the first substrate, the light-emitting elements and the phosphor dots may be disposed on opposite sides of the film. An encapsulating layer may be formed over the phosphor dots. Bonding the film to the first substrate may include or consist essentially of disposing each light-emitting element within a recess in the film, each recess being proximate a different phosphor dot. Prior to bonding the film to the first substrate, a depression may be made in each of the phosphor dots, and bonding the film to the first substrate may include or consist essentially of disposing each light-emitting element at least partially within a depression in a different phosphor dot. Forming the depressions may include or consist essentially of molding and/or embossing. Each of the phosphor dots may have a depression therein derived from the shape of the recess in which the phosphor dot is formed, and bonding the film to the first substrate may include or consist essentially of disposing each light-emitting element at least partially within a depression in a different phosphor dot. The film may be at least partially optically transmissive to unconverted light emitted by the light-emitting elements and/or light emitted by the light-emitting elements wavelength converted by the phosphor dots. The film may include or consist essentially of an acrylic material. The film may include an optical element for diffracting, diffusing, or reflecting light from a light-emitting element or a phosphor dot.

In another aspect, embodiments of the invention feature a lighting system including or consisting essentially of an array of light-emitting elements arranged in a geometric pattern on a substrate and, bonded to the substrate, a film having disposed thereon an array of phosphor dots arranged in at least a portion of the geometric pattern. Each phosphor dot is positioned to wavelength-convert at least a portion of light emitted by a corresponding light-emitting element.

Embodiments of the invention feature one or more of the following in any of a variety of combinations. The film may include or consist essentially of an acrylic material. The film may include an optical element for diffracting, diffusing, or reflecting light from a light-emitting element or a phosphor dot. Each of the light-emitting elements may be embedded within the substrate such that its top surface is substantially coplanar with the top surface of the substrate. At least one of the light-emitting elements may include or consist essentially of a light-emitting diode. A sidewall of at least one of the phosphor dots may form an angle with the top surface of the substrate ranging between approximately 5° and approximately 90°. Each phosphor dot may be adhered (e.g., with an adhesive) directly to a different light-emitting element. Portions of the film and the substrate disposed around the adhered phosphor dots and light-emitting elements may not be in contact. An optically transmissive encapsulating layer may be disposed between the non-contacted portions of the film and the substrate. The light-emitting elements and the phosphor dots may be disposed on opposite sides of the film. An encapsulating layer may be disposed over the phosphor dots. Each light-emitting element may be disposed within a recess in the film, each recess being proximate a different phosphor dot. Each light-emitting element may be disposed at least partially within a depression in a different phosphor dot. The film may be at least partially optically transmissive to unconverted light emitted by the light-emitting elements and/or light emitted by the light-emitting elements wavelength-converted by the phosphor dots.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the terms "substantially" and "approximately" mean ±10%, and in some embodiments, ±5%. As used herein, the terms "pattern" and "geometric pattern" refer to a geometric arrangement, which may be random, pseudo-random, or regularly or semi-regularly repeating.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
FIGS. 1-5 are schematic cross-sectional views of various steps involved in the production of phosphor dots and their application to lighting elements, in accordance with various embodiments of the invention.

With reference to FIG. 1, a substrate 100 contains one or more recesses 110 therein. The substrate 100 may include or consist essentially of a rigid or semi-rigid material, e.g., an acrylic such as polymethyl methacrylate (PMMA). Other exemplary materials for substrate 100 include rigid polymers such as epoxies and polyimides, metals such as aluminum and steel, and silica-based glasses. Substrate 100 need not be light-transmissive, and may therefore be opaque. The recesses 110 are preferably spaced and arranged to correspond to the spacing and arrangement of one or more LEEs with which phosphor dots formed in the recesses 110 will be integrated (as further detailed below). For example, the recesses 110 may be spaced regularly, e.g., in a linear, square, rectangular, triangular, circular, or hexagonal array. Alternatively, the recesses 110 may be located in random or semi-random positions. More generally, the recesses may be arranged in virtually any type of pattern or array, including complex arrays.

The profile of each recess 110 shown in FIG. 1 is a truncated pyramid. However, this is not critical and other profiles—such as rectangular, square, domed, hemispherical, partially ellipsoidal, pyramidal, cuboid, stepped, cupped, horn-shaped, etc.—are possible. The recesses 110 may be formed in the substrate 100 using, e.g., a laser cutting system such as an ILS9.75 Laser Material Processing System from Universal Laser Systems of Scottsdale, Ariz. Other techniques may be used to form recesses 110, for example, machining, photo-chemical machining, particle blasting, chemical etching, and the like. The substrate 100 may even be molded against a negative pattern of the desired recesses to form recesses 110. As described herein, the shape of a recess 110 at least partially determines the shape of the phosphor dot formed therein.

In some embodiments, one or more of the recesses 110 has a lateral dimension (e.g., a diameter or side length) in the range of about 100 μm to about 5000 μm, but these lateral dimensions are not critical; recess 110 may have any suitable lateral dimension. In some embodiments, one or more of the recesses 110 has a depth in the range of about 25 μm to about 1000 μm, but these depths are not critical and a recess 110 may have any suitable depth. In some embodiments, one or more of the recesses 110 has one or more sidewalls that form an angle with the top surface of the substrate 100 (and/or the bottom surface of the recess 110) ranging between, e.g., 5° and 90° (and preferably ranging between 10° and 80°).

Figure 2:

As shown in FIG. 2, one or more of the recesses 110 is at least partially filled with a phosphor slurry 200. A suitable slurry 200 may include or consist essentially of phosphor particles (one or more different types) in a polymeric binder solution. The phosphor particles may include or consist essentially of green aluminate (GAL), lutetium aluminum garnet (LuAG), yttrium aluminum garnet (YAG), SiAlON, $CaAlSiN_3$, and/or other phosphors known in the art. GAL, LuAG, YAG and other materials may be doped with various materials, including, e.g., Ce, Eu, etc. The binder may include or consist essentially of, e.g., a silicone or a polydimethylsiloxane (PDMS)-based binder. Other types of phosphor particles may also be used, depending on the source wavelength(s) used and/or output wavelength(s) desired. Other suitable slurry compositions, with different monomers, binders, solvents, initiators, and/or plasticizers may be straightforwardly identified by those skilled in the art without undue experimentation. In some embodiments the binder has a refractive index greater than about 1.3 or greater than about 1.4, as does, for example, Shin-Etsu ASP 1031. The slurry 200 may be applied to the substrate 100 with a blade or squeegee, or by other technique. After application to the substrate 100, excess slurry 200 may be removed from the surface of the substrate 100, e.g., with a squeegee, leaving the slurry 200 within the recesses 110. In another embodiment, the slurry 200 is dispensed directly into recesses 110 substantially without residue.

The phosphor slurry 200 is then preferably degassed by placing the substrate 100 in a partial vacuum, which may be generated by, e.g., an aspirator or a vacuum pump. After degassing, the binder in the phosphor slurry 200 is typically (at least partially) cured, during which the phosphor slurry 200 (at least partially) hardens into a phosphor dot. The curing process may include or consist essentially of baking the substrate 100 at an elevated temperature, e.g., between approximately 30° C. and 150° C. for approximately 30 to 60 minutes. Curing may also be carried out under partial vacuum (i.e., low pressure). After curing, the substrate 100 may be allowed to cool to approximately room temperature. In some embodiments the degassing stage is omitted. In some embodiments the slurry 200 is cured by techniques other than or in addition to application of heat, for example by exposure to UV radiation, humidity, or the like.

Figure 3:

After curing, any remnants of the phosphor slurry 200 on the surface of the substrate 100 (i.e., not in the recesses 200) may be removed by, e.g., polishing. Such a polishing step may also facilitate the separation of a film later applied to the substrate 100. FIG. 3 depicts the application of a film 300 to the surface of substrate 100 and the exposed surfaces of the now-cured phosphor dots 310. The film 300 is preferably substantially transparent and polymerizable, and may be applied in liquid or gel form. The film 300 is preferably applied evenly (i.e., with a substantially constant thickness) over substrate 100, and may include or consist essentially of PDMS. Other films 300 may alternately be applied, provided that they facilitate adhesion to the cured phosphor dots 310. In some embodiments the film 300 is translucent or opaque rather than transparent, and the film 300 may have waveguiding and/or light-diffusing or light-reflecting properties. In an exemplary embodiment of the invention, the film 300 includes therewithin small light-reflective or refractive elements dispersed throughout at least a portion of its volume. The film 300 may be applied using a doctor blade, Mayer bar or by spin coating, for example.

In some embodiments film 300 is removed at a later stage of manufacture, for example to reduce optical losses that may occur through transmission of light through film 300. The film 300 may be removed by chemically etching it off of the remaining structure, or by mechanically polishing, lapping, peeling or abrading it off of the remaining structure. In some embodiments, the adherence of dots 310 to film 300 is relatively lower than the adherence of dots 310 to the structure to which they are applied, and the dots 310 remain adhered during and after the removal of film 300 (e.g., by peeling).

In one embodiment the side of film 300 opposite the side to which phosphor dots 310 are attached is patterned to form one or more optical elements, e.g., one or more refractive optical elements, diffractive optical elements, diffusive optical elements, Fresnel optical elements, total internal reflection optical elements, scattering elements and/or reflecting elements. For example, film 300 may be formed by dispensing a liquid or gel into a mold (shaped with the optical elements) and applying the substrate 100 to the exposed side of the liquid in the mold.

After application of the film 300, the substrate 100 with the cured phosphor dots 310 and the film 300 is preferably degassed. The degassing may include or consist essentially of application of a partial vacuum, e.g., as generated by an aspirator or a vacuum pump. The film 300 is then cured by, e.g., application of an elevated temperature for, for example, approximately 30 to 60 minutes. The elevated temperature may be in the range of about 30° C. to 150° C., and may be applied at the same time or after the degassing of film 300. The curing preferably not only hardens film 300, but also adheres the phosphor dots 310 to the film 300. As described above, curing may be accomplished via techniques in addition to or instead of application of heat, e.g., by exposure to UV radiation, humidity, or the like. After the film 300 has cured, the substrate 100, film 300, and phosphor dots 310 are cooled, or allowed to cool to about room temperature or below.

In one exemplary embodiment, the film 300 is a liquid photopolymer that is applied by a roller process and cured via exposure to UV radiation to form a flexible and substantially transparent film. The substrate 100 may be coated with a surfactant to prevent bonding of the film 300 to the substrate 100 while bonding to the phosphor dots 310. In some embodiments, the film 300 is a solid film, for example a sheet of plastic such as PET, PEN, acrylic, polycarbonate, or the like. In one embodiment, the film 300 includes a reflector that is reflective to a wavelength of light emitted by the phosphor dot 310 or the LEE to which the phosphor dot 310 is to be coupled (as described below).

Figure 4:
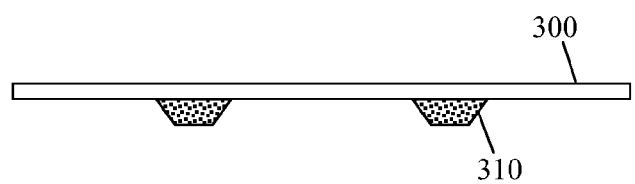

After curing, the cured film 300 is separated from the substrate 100. As shown in FIG. 4, the phosphor dots 310 adhere to the film 300 and are also separated from substrate 100. In some embodiments the separation of the film 300 from the substrate 100 is achieved by using a peeling process. In one embodiment a release agent is applied over all or a portion of the surface of substrate 100 and/or recesses 110 prior to application of film 300 to facilitate removal thereof.

Figure 5:
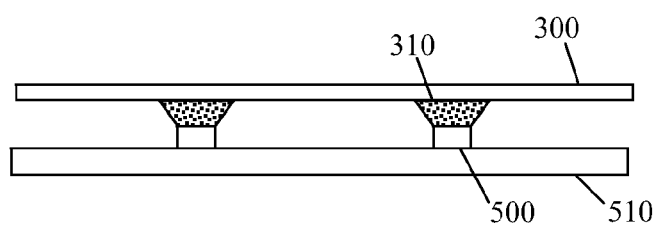

FIG. 5 depicts the application of the film 300 and phosphor dots 310 to an array of LEEs 500 on a substrate 510. As shown in FIG. 5, the arrangement of at least a portion of the array substantially matches that of the phosphor dots 310 such that, e.g., each phosphor dot 310 is disposed over a corresponding LEE 500 when film 300 is applied to substrate 510. The array of LEEs 500 and the phosphor dots 310 may be aligned by, for example, mounting the substrate 510 and the film 300 with matching alignment pins for a robotic handling system or fiducial marks that may subsequently be aligned by a machine-vision system (or a human operator). In some embodiments the alignment and mating of substrate 510 and film 300 is performed in a roll-to-roll process.

The phosphor dots 310 may be attached to the LEEs 500 by any of a variety of techniques. In one embodiment, phosphor dots 310 are attached to LEEs 500 using an adhesive that is transmissive to wavelengths of the light emitted by the LEEs 500. The adhesive may initially be in liquid form, for example Dymax 3099, or in tape form, for example 3M 8171 or 8211. While FIG. 5 shows phosphor dot 310 in contact with LEE 500, this is not a limitation of the present invention and in other embodiments the phosphor dot 310 is spaced apart from LEE 500. The space between the LEE 500 and the phosphor dot 310 may be filled or partially filed with a substantially transparent material (e.g., air or another fluid or a polymeric material). In one embodiment the space between LEE 500 and phosphor dot 310 is filled with a transparent material having a refractive index greater than about 1.3, preferably greater than about 1.4, for index-of-refraction matching to reduce total-internal-reflection losses.

The contact surface area between the LEEs 500 and the phosphor dots 310 may be identical, close to identical, or significantly different. If the surfaces of the phosphor dots 310 are larger than those of the corresponding LEEs 500, then more light emitted from the sides of the LEEs 500 will impinge on the phosphor dot 310 and be converted to a different wavelength. Phosphor dots 310 with a smaller surface area (than their corresponding LEEs 500) may be applied to LEEs 500 that emit only through a portion of their upper surface, or if only a fraction of the light emitted from essentially the whole of the upper surface is to be wavelength-converted.

Figure 6:
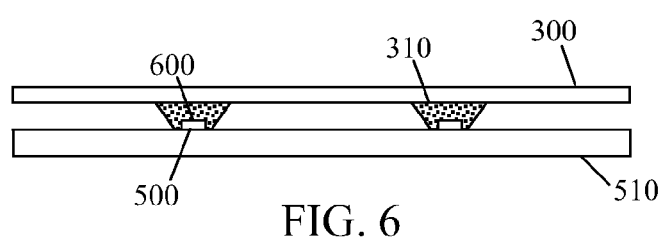
FIGS. 6-12 are schematic cross-sectional views of arrays of lighting elements integrated with phosphor dots in accordance with various embodiments of the invention.

In an alternate embodiment, shown in FIG. 6, depressions 600 are formed in some or all of the phosphor dots 310 by, e.g., embossing (for example via secondary molds), and the LEEs 500 fit within the depressions 600 when joined to phosphor dots 310 and the film 300. This arrangement allows light emitted from the sides of the LEEs 500 to better impinge on the phosphor dots 310 and be wavelength-converted. The LEEs 500 may have a snug or a loose fit in the depressions 600. A transparent index-matching encapsulant such as PDMS or optical epoxy may be applied to optically couple the LEEs 500 to the phosphor dots 310. In one embodiment depressions 600 are formed by modifying the shape of the original recesses 110 such that they contain a negative image of the desired depression.

Figure 7:
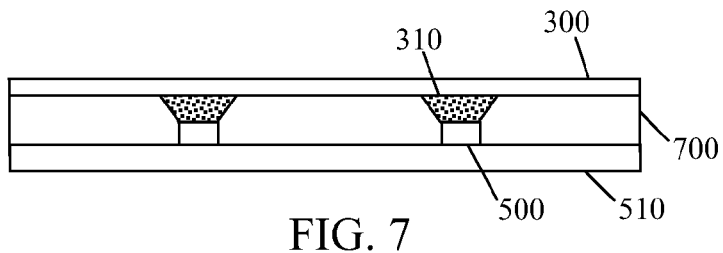
Figure 8:
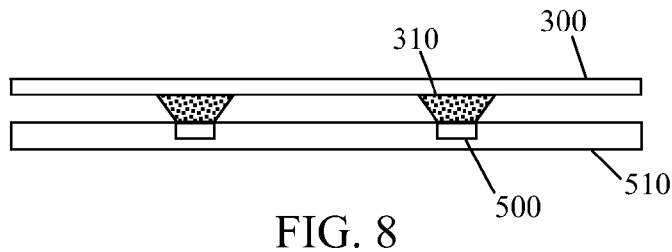

In some embodiments of the present invention, as shown in FIG. 7, an optically transmissive encapsulant layer 700 is provided between the film 300 and the substrate 510. Such an encapsulant layer 700 may also be applied to the embodiment depicted in FIG. 6. FIG. 8 depicts an embodiment in which the top surfaces of the LEEs 500 and the substrate 510 are substantially coplanar. For example, the LEEs 500 may be embedded within the substrate 510 or within recesses therein. Again, an encapsulant layer 700 may be provided between the film 300 and the substrate 510 in such embodiments.

Figure 9:
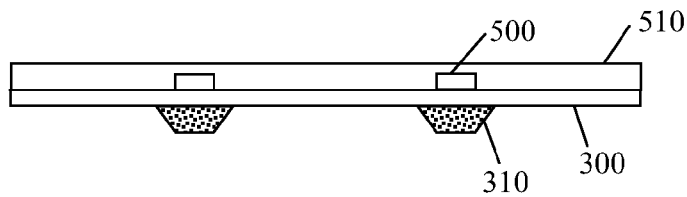
Figure 10:
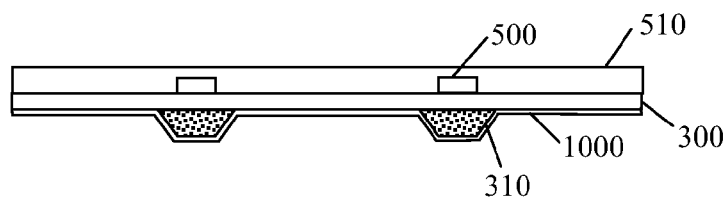

In various embodiments of the present invention in which direct contact between LEEs 500 and the phosphor dots 310 is not desired (for example to avoid excessive heating of the phosphor dots 310 during operation of the LEEs 500), the film 300 itself may be utilized to space the phosphor dots 310 from the LEEs 500. As shown in FIG. 9, the substrate 510 may be applied to the side of film 300 opposite the side to which the phosphor dots 310 are adhered. The LEEs 500 may be embedded within the substrate 510, and thus may be spaced away from the phosphor dots 310 by a distance substantially equal to the thickness of the film 300. As shown in FIG. 10, a light-transmissive encapsulant layer 1000 may be applied over the phosphor dots 310 (and optionally over the surface of the film 300 to which they are adhered). The encapsulant layer 1000 may be applied in liquid form and subsequently cured or may be applied as a film, e.g., using an adhesive or a lamination process.

Figure 11:
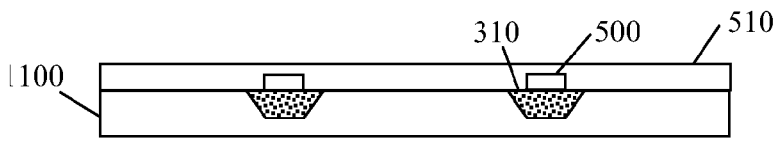

FIG. 11 depicts an embodiment in which the phosphor dots 310 have been prepared in recesses in a substrate 1100 (which may be similar to substrate 100), for example, as described above. A substrate 510 with embedded LEEs 500 is then applied to the substrate 1100 and/or the phosphor dots 310. The substrate 1100 may be substantially transparent to light emitted by the phosphor dots 310 and/or the LEEs 500, in which case light therefrom may be emitted through substrate 1100. Alternatively, substrate 1100 may be substantially reflective, and the converted light from the phosphor dots 310 may be reflected back and emitted through substrate 510. The substrate 510 may be separated from substrate 1100, leaving the phosphor dots 310 adhered to the LEEs 500 and/or the substrate 510. In such embodiments the substrate 1100 need not be light-transmissive. The substrate 510 may be thin enough and flexible enough to be peeled from the substrate 1100. Alternately, the substrate 1100 may be thin and flexible enough to be peeled from the substrate 510.

Figure 12:
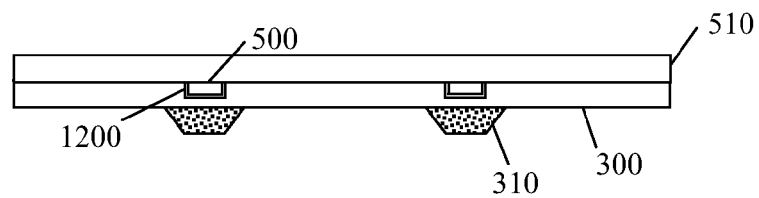

FIG. 12 depicts an embodiment in which the film 300 with thick phosphor dots 310 has one or more recesses 1200 in the side of the film 300 opposite the side on which the phosphor dots 310 are adhered. In some embodiments the recesses 1200 extend through less than half of the thickness of the film 300. The substrate 510, with LEEs 500 disposed thereon, is attached to the film 300 such that the LEEs 500 fit inside the recesses 1200. The LEEs 500 may fit snugly or loosely within the recesses 1200. In one embodiment, the film 300 is cured with the LEEs 500 in place after film 300 is attached to the substrate 510.

Figure 13:
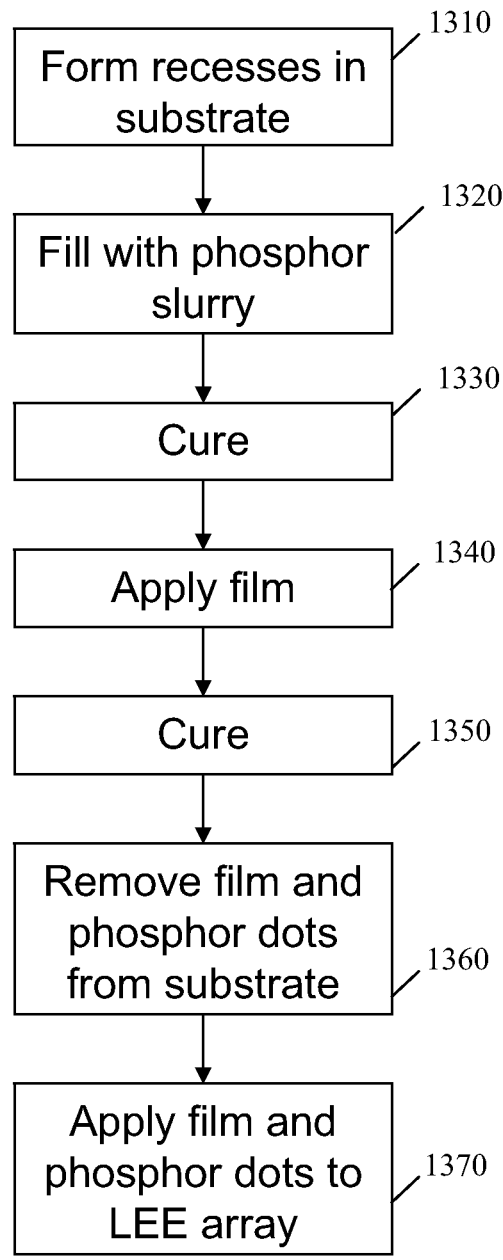
FIGS. 13 and 14 are flowcharts describing exemplary processes for the production of phosphor dots and their application to arrays of lighting elements, in accordance with various embodiments of the invention.

The phosphor dots and LEE arrays integrated therewith may be formed in accordance with the flowchart depicted in FIG. 13 and with various details provided above. In a first step 1310, recesses are formed in a substrate (e.g., an acrylic sheet). In a step 1320, the recesses are at least partially filled with a phosphor slurry, which is cured in a step 1330 to form phosphor dots in the recesses. A preferably optically transmissive film is applied to the substrate in a step 1340 and cured in a step 1350. In a step 1360, the film and the phosphor dots are removed from the substrate, and then in a step 1370, the film and/or the phosphor dots are adhered to an array of LEEs.

Figure 14:
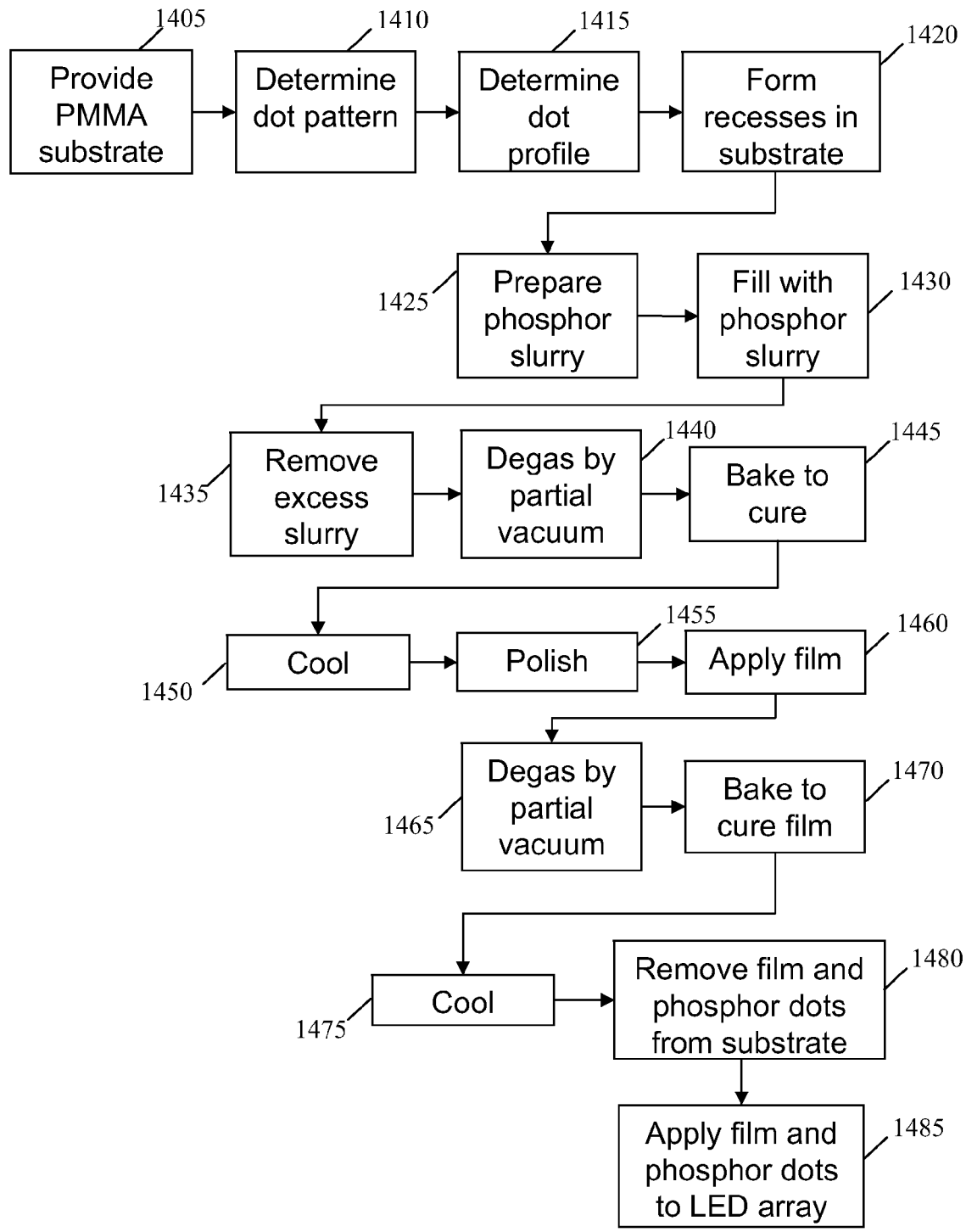

The phosphor dots and LEE arrays integrated therewith may also be formed in accordance with the more detailed flowchart depicted in FIG. 14 and with various details provided above. In a first step 1405, a substantially planar acrylic (e.g., PMMA) substrate is provided, and in a second step 1410, a desired pattern of phosphor dots is determined by, e.g., considering the pattern of at least a portion of an array of LEEs with which the phosphor dots will be integrated. In a step 1415, a profile (e.g., shape and/or edge profile) of the dots is determined considering, e.g., the size of the LEEs in the array and the surface(s) (or portions thereof) from which they emit light. In a step 1420, one or more recesses are formed in a pattern substantially corresponding to the pattern determined in a step 1410. A phosphor slurry is prepared in step 1425 by, e.g., mixing phosphor particles into a PDMS binder. In a step 1430, at least a portion of at least one of the recesses is filled with the slurry. If present, excess slurry is removed from the substrate surface in a step 1435, thereby leaving the slurry substantially only in the recesses. In a step 1440 the slurry is degassed by, e.g., application of a partial vacuum, and in a step 1445 the phosphor dots are formed via the curing (by, e.g., baking at elevated temperature) of the phosphor slurry. The substrate is cooled to approximately room temperature in a step 1450, and the surface of the substrate is polished to remove any residual binder from areas between the recesses in a step 1455.

In a step 1460, an optically transmissive film (which may include or consist essentially of, e.g., a polymeric material) is applied to the substrate surface. The film is degassed by, e.g., application of a partial vacuum, in a step 1465 and then cured in a step 1470 by, e.g., baking at an elevated temperature. The film and substrate are cooled to approximately room temperature in a step 1475, and the film (with the phosphor dots now attached thereto) is removed from the substrate in a step 1480. Finally, in a step 1485 the film and/or the phosphor dots are adhered to an array of LEEs.

Embodiments of the present invention include variations of the processes described above. For example, the phosphor slurry may be disposed in the recesses and the optically transmissive film may be applied to the substrate prior to curing of the phosphor slurry. In such embodiments the film and the phosphor slurry are degassed and cured together. In some embodiments, one or more steps listed in FIGS. 13 and 14 are performed in a different order or are omitted. For example, the optically transmissive film may be applied in solid form to which the phosphor dots adhere more strongly than to the substrate in which they are initially formed. In such embodiments the degassing and/or curing of the film may be omitted.

In some embodiments, multiple films 300 with different phosphor dots 310 are prepared and applied to different portions of an array of LEEs 500 on a common substrate 510. For example, after formation of phosphor dots 310, each of the films 300 may be tested to provide a map of its optical characteristics, e.g., conversion efficiency (for example, lumens of light emitted per optical watts absorbed) and spectral power density or color of the excited light. The map may then be used to separate film 300 into sub-films, each of which has different optical characteristics. The different sub-films may then be sorted and binned and applied to LEEs 500 on a common substrate 510 to achieve improved uniformity of one or more optical characteristics of the lighting system, for example optical power, color temperature, color rendering index, or the like.

In one embodiment, the LEEs 500 are tested to produce maps of their characteristics (for example, wavelength and/or light output power). The maps of LEE 500 characteristics may then be divided into groups or bins with relatively narrower distributions of characteristics than are present on the entire substrate 510. This information is then used to determine which sub-film of phosphor dots is mated with a particular group or bin of LEEs 500 to achieve improved uniformity of one or more optical characteristics of the lighting system, for example optical power, color temperature, color rendering index, or the like.

In some cases, different phosphor mixes are applied to the LEEs 500 in multiple steps. For example, three smaller arrays each of a different phosphor type may be applied in three separate steps to a larger array of LEEs 500. Alternatively, a larger array of different-type phosphor dots 310 may be produced and then applied in a single step to the LEEs 500. In such embodiments, the substrate 100 may be masked or otherwise protected with a barrier while a selection of the recesses 110 are filled with a particular phosphor slurry. This may be repeated by masking different areas of the substrate 100 while different phosphor mixes are applied to different recesses 110.

Some or all of the recesses 110 in the substrate 100 may have different sizes and/or shapes, including different heights (i.e., depths). Techniques described herein may be implemented with rollers rather than with flat sheets of material.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming a lighting system comprising an array of light-emitting elements arranged in a geometric pattern on a first substrate, the method comprising:
forming, in a pattern corresponding to at least a portion of the geometric pattern, an array of recesses in a second substrate different from the first substrate;
forming, in each recess, a phosphor dot that at least partially fills the recess; and
transferring the phosphor dots from the second substrate to the first substrate such that each phosphor dot is positioned to wavelength-convert at least a portion of light emitted by a corresponding light-emitting element on the first substrate,
wherein each of the light-emitting elements is embedded within the first substrate such that its top surface is substantially coplanar with a top surface of the first substrate.

2. The method of claim 1, wherein forming the phosphor dot comprises (i) at least partially filling the recess with a slurry comprising phosphor particles and a binder and (ii) curing the slurry.

3. The method of claim 2, further comprising at least one of (i) substantially removing slurry from a surface of the second substrate or (ii) degassing the slurry.

4. The method of claim 3, wherein the slurry is degassed, and the degassing comprises application of a partial vacuum to the slurry.

5. The method of claim 2, wherein curing the slurry comprises application of at least one of heat or ultraviolet radiation.

6. The method of claim 1, wherein forming the array of recesses comprises at least one of etching, molding, machining, or laser cutting.

7. The method of claim 1, wherein at least one of the light-emitting elements comprises a light-emitting diode.

8. The method of claim 1, wherein a sidewall of at least one of the phosphor dots forms an angle with a top surface of the first substrate ranging between approximately 5° and approximately 90°.

9. The method of claim 1, wherein transferring the phosphor dots comprises:
forming a film over the second substrate, thereby adhering the phosphor dots to the film;
removing the film from the second substrate, the phosphor dots remaining adhered to the film; and
bonding the film to the first substrate.

10. The method of claim 9, wherein forming the film over the second substrate comprises (i) dispersing a liquid or gel precursor of the film over the second substrate and (ii) curing the precursor, thereby forming the film.

11. The method of claim 10, further comprising degassing the precursor prior to curing.

12. The method of claim 9, wherein bonding the film to the first substrate comprises adhering each phosphor dot directly to a different light-emitting element.

13. The method of claim 12, wherein portions of the film and the first substrate disposed around the adhered phosphor dots and light-emitting elements are not in contact.

14. The method of claim 13, further comprising forming an optically transmissive encapsulating layer between the non-contacted portions of the film and the first substrate.

15. The method of claim 9, wherein, after bonding the film to the first substrate, the light-emitting elements and the phosphor dots are disposed on opposite sides of the film.

16. The method of claim 15, further comprising forming an encapsulating layer over the phosphor dots.

17. The method of claim 9, wherein bonding the film to the first substrate comprises disposing each light-emitting element within a recess in the film, each recess being proximate a different phosphor dot.

18. The method of claim 9, wherein (i) each of the phosphor dots has a depression therein derived from a shape of the recess in which the phosphor dot is formed, and (ii) bonding the film to the first substrate comprises disposing each light-emitting element at least partially within a depression in a different phosphor dot.

19. The method of claim 9, wherein the film is at least partially optically transmissive to at least one of unconverted light emitted by the light-emitting elements or light emitted by the light-emitting elements wavelength-converted by the phosphor dots.

20. The method of claim 9, wherein the film comprises an acrylic material.

21. The method of claim 9, wherein the film comprises an optical element for diffracting, diffusing, or reflecting light from at least one of a light-emitting element or a phosphor dot.

22. A method of forming a lighting system comprising an array of light-emitting elements arranged in a geometric pattern on a first substrate, the method comprising:
    forming, in a pattern corresponding to at least a portion of the geometric pattern, an array of recesses in a second substrate different from the first substrate;
    forming, in each recess, a phosphor dot that at least partially fills the recess; and
    transferring the phosphor dots from the second substrate to the first substrate such that each phosphor dot is positioned to wavelength-convert at least a portion of light emitted by a corresponding light-emitting element on the first substrate,
    wherein transferring the phosphor dots comprises:
        forming a film over the second substrate, thereby adhering the phosphor dots to the film, forming the film over the second substrate comprising (i) dispersing a liquid or gel precursor of the film over the second substrate and (ii) curing the precursor, thereby forming the film,
        removing the film from the second substrate, the phosphor dots remaining adhered to the film, and
        bonding the film to the first substrate.

23. The method of claim 22, wherein forming the phosphor dot comprises (i) at least partially filling the recess with a slurry comprising phosphor particles and a binder and (ii) curing the slurry.

24. The method of claim 23, further comprising at least one of (i) substantially removing slurry from a surface of the second substrate or (ii) degassing the slurry.

25. The method of claim 24, wherein the slurry is degassed, and the degassing comprises application of a partial vacuum to the slurry.

26. The method of claim 23, wherein curing the slurry comprises application of at least one of heat or ultraviolet radiation.

27. The method of claim 22, wherein forming the array of recesses comprises at least one of etching, molding, machining, or laser cutting.

28. The method of claim 22, wherein at least one of the light-emitting elements comprises a light-emitting diode.

29. The method of claim 22, wherein a sidewall of at least one of the phosphor dots forms an angle with a top surface of the first substrate ranging between approximately 5° and approximately 90°.

30. The method of claim 22, further comprising degassing the precursor prior to curing.

31. The method of claim 22, wherein bonding the film to the first substrate comprises adhering each phosphor dot directly to a different light-emitting element.

32. The method of claim 31, wherein portions of the film and the first substrate disposed around the adhered phosphor dots and light-emitting elements are not in contact.

33. The method of claim 32, further comprising forming an optically transmissive encapsulating layer between the non-contacted portions of the film and the first substrate.

34. The method of claim 22, wherein, after bonding the film to the first substrate, the light-emitting elements and the phosphor dots are disposed on opposite sides of the film.

35. The method of claim 34, further comprising forming an encapsulating layer over the phosphor dots.

36. The method of claim 22, wherein bonding the film to the first substrate comprises disposing each light-emitting element within a recess in the film, each recess being proximate a different phosphor dot.

37. The method of claim 22, further comprising, prior to bonding the film to the first substrate, forming a depression in each of the phosphor dots, wherein bonding the film to the first substrate comprises disposing each light-emitting element at least partially within a depression in a different phosphor dot.

38. The method of claim 37, wherein forming the depressions comprises at least one of molding or embossing.

39. The method of claim 22, wherein (i) each of the phosphor dots has a depression therein derived from a shape of the recess in which the phosphor dot is formed, and (ii) bonding the film to the first substrate comprises disposing each light-emitting element at least partially within a depression in a different phosphor dot.

40. The method of claim 22, wherein the film is at least partially optically transmissive to at least one of unconverted light emitted by the light-emitting elements or light emitted by the light-emitting elements wavelength-converted by the phosphor dots.

41. The method of claim 22, wherein the film comprises an acrylic material.

42. The method of claim 22, wherein the film comprises an optical element for diffracting, diffusing, or reflecting light from at least one of a light-emitting element or a phosphor dot.

43. A method of forming a lighting system comprising an array of light-emitting elements arranged in a geometric pattern on a first substrate, the method comprising:
    forming, in a pattern corresponding to at least a portion of the geometric pattern, an array of recesses in a second substrate different from the first substrate;
    forming, in each recess, a phosphor dot that at least partially fills the recess; and
    transferring the phosphor dots from the second substrate to the first substrate such that each phosphor dot is positioned to wavelength-convert at least a portion of light emitted by a corresponding light-emitting element on the first substrate,
    wherein transferring the phosphor dots comprises:
        forming a film over the second substrate, thereby adhering the phosphor dots to the film,
        removing the film from the second substrate, the phosphor dots remaining adhered to the film, and
        bonding the film to the first substrate, and
    wherein (i) bonding the film to the first substrate comprises adhering each phosphor dot directly to a different light-emitting element, and (ii) portions of the film and the first substrate disposed around the adhered phosphor dots and light-emitting elements are not in contact.

44. The method of claim 43, wherein forming the phosphor dot comprises (i) at least partially filling the recess with a slurry comprising phosphor particles and a binder and (ii) curing the slurry.

45. The method of claim 44, further comprising at least one of (i) substantially removing slurry from a surface of the second substrate or (ii) degassing the slurry.

46. The method of claim 45, wherein the slurry is degassed, and the degassing comprises application of a partial vacuum to the slurry.

47. The method of claim 44, wherein curing the slurry comprises application of at least one of heat or ultraviolet radiation.

48. The method of claim 43, wherein forming the array of recesses comprises at least one of etching, molding, machining, or laser cutting.

49. The method of claim 43, wherein at least one of the light-emitting elements comprises a light-emitting diode.

50. The method of claim 43, wherein a sidewall of at least one of the phosphor dots forms an angle with a top surface of the first substrate ranging between approximately 5° and approximately 90°.

51. The method of claim 43, further comprising forming an optically transmissive encapsulating layer between the non-contacted portions of the film and the first substrate.

52. The method of claim 43, wherein, after bonding the film to the first substrate, the light-emitting elements and the phosphor dots are disposed on opposite sides of the film.

53. The method of claim 52, further comprising forming an encapsulating layer over the phosphor dots.

54. The method of claim 43, wherein bonding the film to the first substrate comprises disposing each light-emitting element within a recess in the film, each recess being proximate a different phosphor dot.

55. The method of claim 43, further comprising, prior to bonding the film to the first substrate, forming a depression in each of the phosphor dots, wherein bonding the film to the first substrate comprises disposing each light-emitting element at least partially within a depression in a different phosphor dot.

56. The method of claim 55, wherein forming the depressions comprises at least one of molding or embossing.

57. The method of claim 43, wherein (i) each of the phosphor dots has a depression therein derived from a shape of the recess in which the phosphor dot is formed, and (ii) bonding the film to the first substrate comprises disposing each light-emitting element at least partially within a depression in a different phosphor dot.

58. The method of claim 43, wherein the film is at least partially optically transmissive to at least one of unconverted light emitted by the light-emitting elements or light emitted by the light-emitting elements wavelength-converted by the phosphor dots.

59. The method of claim 43, wherein the film comprises an acrylic material.

60. The method of claim 43, wherein the film comprises an optical element for diffracting, diffusing, or reflecting light from at least one of a light-emitting element or a phosphor dot.

61. A method of forming a lighting system comprising an array of light-emitting elements arranged in a geometric pattern on a first substrate, the method comprising:
forming, in a pattern corresponding to at least a portion of the geometric pattern, an array of recesses in a second substrate different from the first substrate;
forming, in each recess, a phosphor dot that at least partially fills the recess; and
transferring the phosphor dots from the second substrate to the first substrate such that each phosphor dot is positioned to wavelength-convert at least a portion of light emitted by a corresponding light-emitting element on the first substrate,
wherein transferring the phosphor dots comprises:
forming a film over the second substrate, thereby adhering the phosphor dots to the film,
removing the film from the second substrate, the phosphor dots remaining adhered to the film,
forming a depression in each of the phosphor dots, and
thereafter, bonding the film to the first substrate, bonding the film to the first substrate comprising disposing each light-emitting element at least partially within a depression in a different phosphor dot.

62. The method of claim 61, wherein forming the phosphor dot comprises (i) at least partially filling the recess with a slurry comprising phosphor particles and a binder and (ii) curing the slurry.

63. The method of claim 62, further comprising at least one of (i) substantially removing slurry from a surface of the second substrate or (ii) degassing the slurry.

64. The method of claim 63, wherein the slurry is degassed, and the degassing comprises application of a partial vacuum to the slurry.

65. The method of claim 62, wherein curing the slurry comprises application of at least one of heat or ultraviolet radiation.

66. The method of claim 61, wherein forming the array of recesses comprises at least one of etching, molding, machining, or laser cutting.

67. The method of claim 61, wherein at least one of the light-emitting elements comprises a light-emitting diode.

68. The method of claim 61, wherein a sidewall of at least one of the phosphor dots forms an angle with a top surface of the first substrate ranging between approximately 5° and approximately 90°.

69. The method of claim 61, wherein forming the depressions comprises at least one of molding or embossing.

70. The method of claim 61, wherein the film is at least partially optically transmissive to at least one of unconverted light emitted by the light-emitting elements or light emitted by the light-emitting elements wavelength-converted by the phosphor dots.

71. The method of claim 61, wherein the film comprises an acrylic material.

72. The method of claim 61, wherein the film comprises an optical element for diffracting, diffusing, or reflecting light from at least one of a light-emitting element or a phosphor dot.

73. A method of forming a lighting system comprising an array of light-emitting elements arranged in a geometric pattern on a first substrate, the method comprising:
forming, in a pattern corresponding to at least a portion of the geometric pattern, an array of recesses in a second substrate different from the first substrate;
forming, in each recess, a phosphor dot that at least partially fills the recess; and
transferring the phosphor dots from the second substrate to the first substrate such that each phosphor dot is positioned to wavelength-convert at least a portion of light emitted by a corresponding light-emitting element on the first substrate,
wherein transferring the phosphor dots comprises:
forming a film over the second substrate, thereby adhering the phosphor dots to the film,
removing the film from the second substrate, the phosphor dots remaining adhered to the film, and
bonding the film to the first substrate, and
wherein (i) each of the phosphor dots has a depression therein derived from a shape of the recess in which the phosphor dot is formed, and (ii) bonding the film to the first substrate comprises disposing each light-emitting element at least partially within a depression in a different phosphor dot.

74. The method of claim 73, wherein forming the phosphor dot comprises (i) at least partially filling the recess with a slurry comprising phosphor particles and a binder and (ii) curing the slurry.

75. The method of claim 74, further comprising at least one of (i) substantially removing slurry from a surface of the second substrate or (ii) degassing the slurry.

76. The method of claim 75, wherin the slurry is degassed, and the degassing comprises application of a partial vacuum to the slurry.

77. The method of claim 74, wherein curing the slurry comprises application of at least one of heat or ultraviolet radiation.

78. The method of claim 73, wherein forming the array of recesses comprises at least one of etching, molding, machining, or laser cutting.

79. The method of claim 73, wherein at least one of the light-emitting elements comprises a light-emitting diode.

80. The method of claim 73, wherein a sidewall of at least one of the phosphor dots forms an angle with a top surface of the first substrate ranging between approximately 5° and approximatley 90°.

81. The method of claim 73, wherein bonding the film to the first substrate comprises adhering each phosphor dot directly to a different light-emitting element.

82. The method of claim 73, wherein the film is at least partially optically transmissive to at least one of unconverted light emitted by the light-emitting elements or light emitted by the light-emitting elements wavelength-converted by the phosphor dots.

83. The method of claim 73, wherein the film comprises an acrylic material.

84. The method of claim 73, wherein the film comprises an optical element for diffracting, diffusing, or reflecting light from at least one of a light-emitting element or a phosphor dot.

\* \* \* \* \*